United States Patent [19]

Iyehara et al.

[11] 4,433,395
[45] Feb. 21, 1984

[54] APPARATUS AND METHOD FOR REFRESHING NON-VOLATILE MEMORY

[75] Inventors: Sadahiro Iyehara, Suita; Kazumi Kawashima; Minoru Ueda, both of Takatsuki; Keisuke Yamamoto; Tatsuhiro Hosokawa, both of Ibaraki; Yukio Furuta, Kusatsu, all of Japan

[73] Assignee: Matsushita Electric Industrial Co., Ltd., Kadoma, Japan

[21] Appl. No.: 257,618

[22] Filed: Apr. 27, 1981

[30] Foreign Application Priority Data

May 6, 1980 [JP] Japan ................... 55-60156

[51] Int. Cl.³ ............................................ G11C 13/00
[52] U.S. Cl. ..................................... 365/222; 371/66
[58] Field of Search ............... 365/222, 226, 228, 229, 365/230; 371/10, 14, 66

[56] References Cited

U.S. PATENT DOCUMENTS 4,145,761  3/1979  Gunter et al. ..................... 365/229
4,323,987  4/1982  Holtz et al. ....................... 365/229
4,337,524  6/1982  Parkinson ........................... 371/66

Primary Examiner—Terrell W. Fears
Attorney, Agent, or Firm—Cushman, Darby & Cushman

[57] ABSTRACT

In the refreshing of the memory contents of the non-volatile memory device, a refreshing buffer memory is provided for temporarily storing a data signal of an address to be refreshed. Not only this data signal is stored in the refreshing buffer memory, but also the address of this data signal and the status of the refreshing processes, that is, up to which step of the refreshing routine the refreshing operation has proceeds, is stored in this refreshing buffer memory. Then, even when the power supply is shut off during the course of the refreshing action, at the next chance of the resumption of the power supply, the refreshing routine can correctly be started from the step at which the refreshing routine was previously terminated, thereby the refreshing operation can always be completed correctly.

12 Claims, 3 Drawing Figures

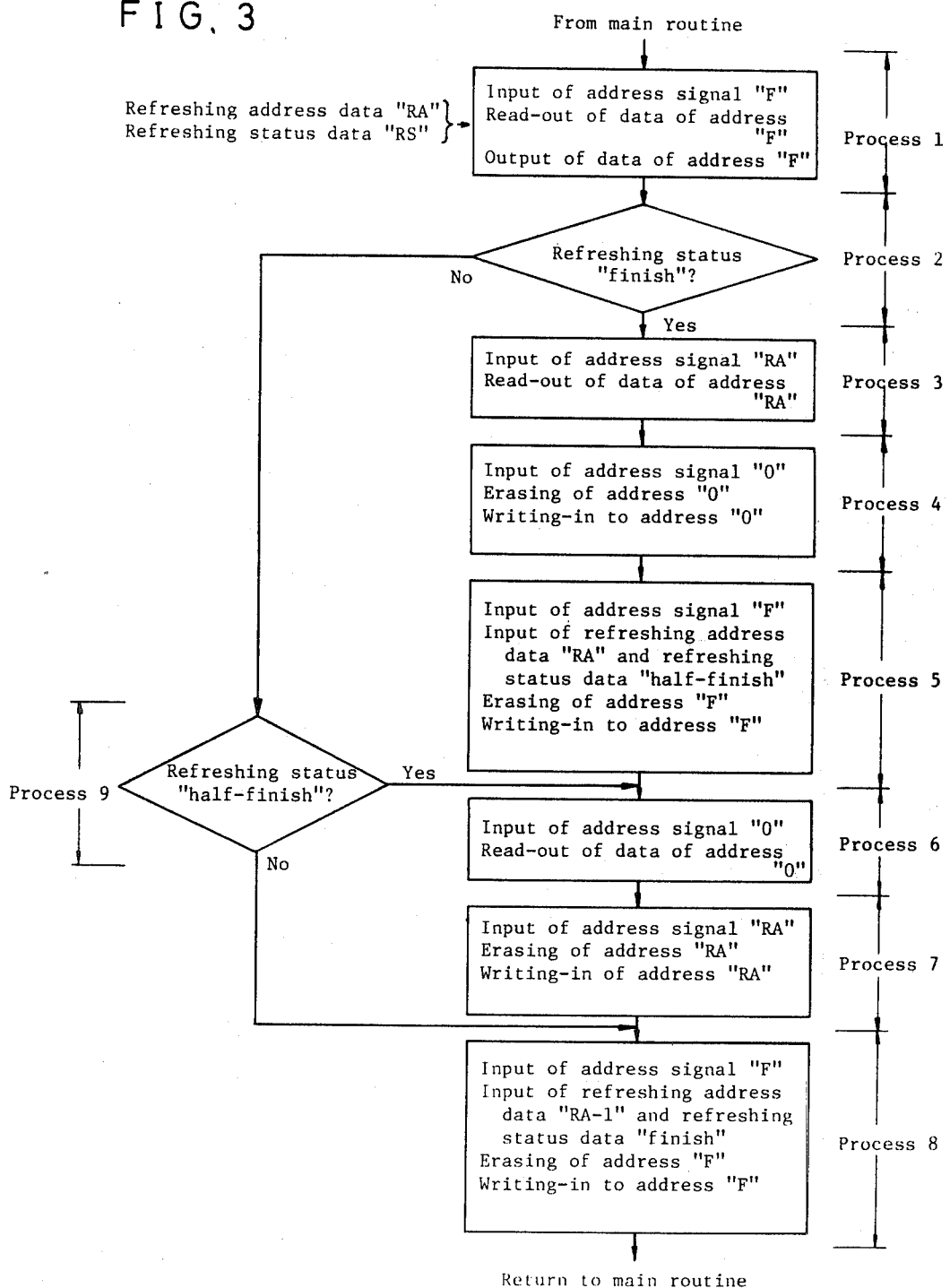

APPARATUS AND METHOD FOR REFRESHING NON-VOLATILE MEMORY

FIELD OF THE INVENTION

This invention relates to an apparatus and method of refreshing non-volatile memories, such as MNOS (Metal Nitride Oxide Semiconductor) memories, and provides, even in the case of stoppage of the power supply during the refreshing action, a refreshing scheme which insures that the contents of the memory are not erased or disturbed.

BACKGROUND OF THE INVENTION

Although among the non-volatile memory devices such as MNOS memories there have been memories having a memory holding capability of more than ten years, for obtaining a more reliable memory holding capability, it is common to employ a so-called refreshing operation, that is, the repeated operation, over an adequate interval, of reading-out of the contents in an address of the memory and rewriting-in of the same memory contents into the same address. In this refreshing operation of the memory, there has been a problem in that the refreshing action takes a rather long time. For example, in a MNOS memory, about 150 msec is necessary for its read-out and write-in action, respectively, per address, that is, about 300 msec or more is necessary for completion of a total refreshing action per address. In such a rather slow refreshing action, there is always a risk with a high probability that the power supply will shut off during the course of the refreshing action due to turning-off of the power switch or the stoppage of the power supply. In such a case false operations such as a permanent loss of the memory or an accidental conversion of the memory contents might be caused.

Taking an example of the conventional refreshing scheme, the abovementioned problem in a conventional scheme is explained below. In a MNOS memory, a data signal at an address to be refreshed (hereinafter this address is called as a refreshing address) is read out from the addressed location and is stored first in a data register comprising, for example, a shift register. Then as a next step all of the contents of this refreshing address is erased and thereafter the data signal, which has been stored in the data register, is rewritten into this refreshing address. In the above process, since the data register used is a volatile memory, if the power supply is shut off during the processes after the erasure process but before the rewriting process, the contents of the data register are all erased. Accordingly, the entire data signal of the refreshing address is lost forever or is lost partly, giving falsely converted data.

For preventing the problem described above, in the conventional refreshing scheme of a MNOS memory, it is constructed in a manner such that, even when the power supply is shut off during the course of the refreshing action, the power supply inside the device is kept running for a period which is enough to cover the necessary time for finishing the refreshing routine presently in progress, thereby the memory is protected from the aforementioned problem. However, for attaining the abovementioned countermeasure for the false operations in the MNOS memory, any means capable of holding the power supply inside the device for at least 300 msec is necessary. This means an installation of a bulky capacitor. Even with the use of an electrolytic capacitor, the device becomes insufficiently compact, and also the construction of its control circuit becomes complicated causing the cost of the device to rise. These drawbacks have been existing in the conventional refreshing schemes employed in non-volatile memories such as in MNOS memories.

SUMMARY OF THE INVENTION

This invention removes the drawbacks which hitherto existed in the conventional apparatus and methods for refreshing non-volatile memories, and presents a new apparatus and methods for refreshing it, which can protect the contents of the memory even when the power supply is shut off during its refreshing action and can be realized by a relatively simple means without using a bulky capacitor.

BRIEF EXPLANATION OF THE DRAWING

FIG. 3 is a flow chart of the refreshing scheme of the preferred embodiment of the invention.

DESCRIPTION OF THE PREFERRED EMBODIMENT

For protecting the contents of the memory even when its power supply is shut off during the refreshing action, the apparatus and method for refreshing a non-volatile memory in accordance with the present invention is devised such that in any step of its refreshing routine, the data signal is always held in a refreshing address or in a refreshing buffer memory which is in the non-volatile memory device. Therefore even in the case of stoppage of the power supply during the course of the refreshing action, it is assured that the data signal is held in the refreshing buffer memory. In addition to this, address data representing the refreshing address where the present data signal has been held and status data representing the step of the refreshing routine that the refreshing action was interrupted due to the stoppage of the power supply are also stored in a part of this non-volatile memory device. Thereby when the power supply is resumed by turning on the power switch or at the next chance of the operation of the device or by the recovery of the power supply stoppage, the refreshing operation can be started from that step of the refreshing routine, which was on the way of refreshing at the preceding chance of the device operation, and thus the whole refreshing routine can be completed any time.

In the following, the present invention is elucidated in detail with reference to the drawings showing an embodiment done on the refreshing operation of an MNOS memory device.

Construction of the Apparatus

Figure 1:
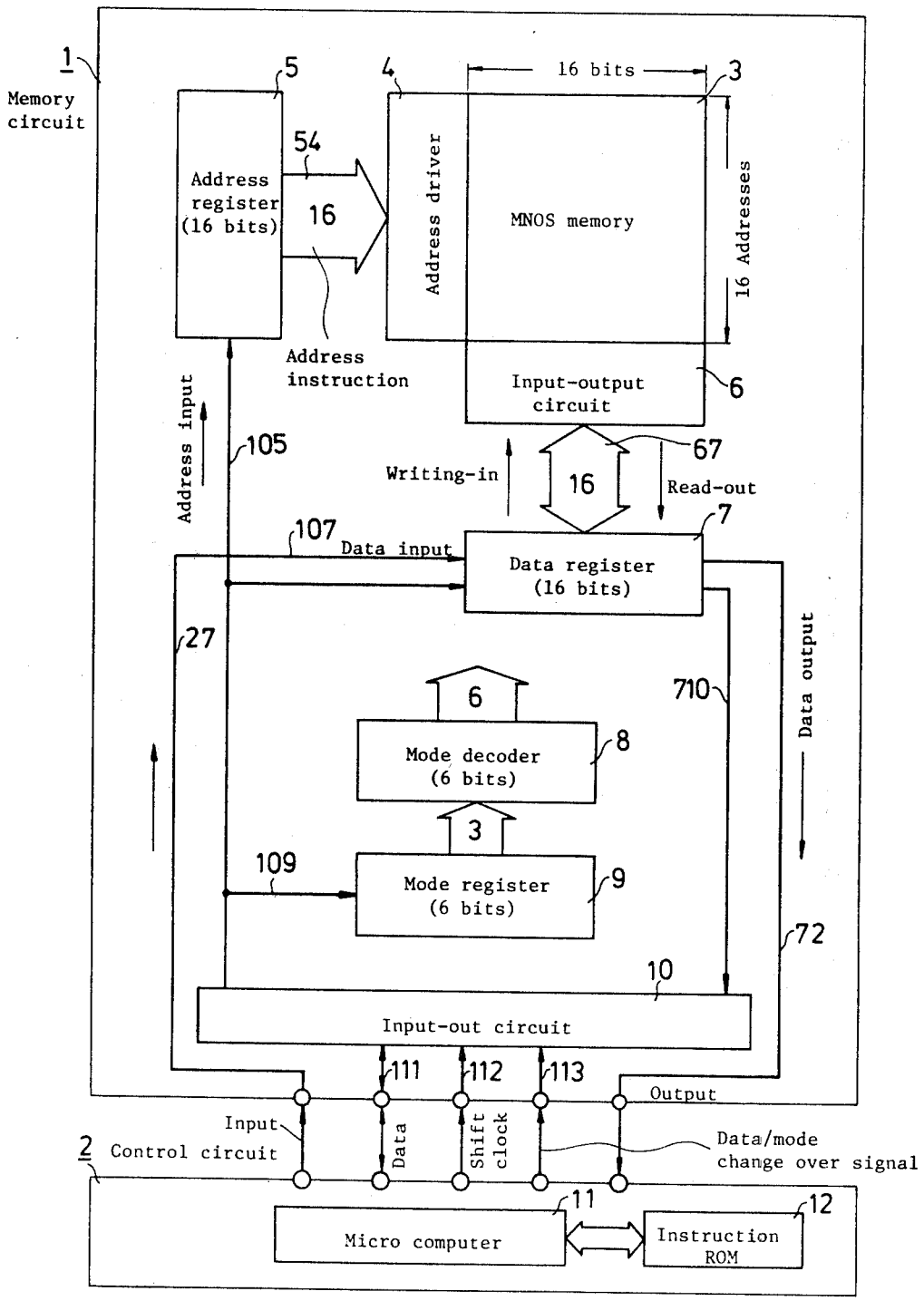
FIG. 1 is a block diagram of the preferred embodiment of a memory device having a refreshing scheme for a non-volatile memory device.

In FIG. 1, the whole of the memory device in accordance with the refreshing scheme of the present invention is shown as a block diagram. One is a memory circuit, and 2 is its controlling circuit. The memory circuit 1 comprises mainly an MNOS memory 3 having a memory size of as much as 16 addresses of 16 bit unit memory cell. An address of the memory 3 which is to be read out or written in is designated by an address register 5 through an address driver 4, and the contents of that address is read out to or written in from a data register 7 through an input-output circuit 6. The data register 7 comprises mainly a 16 bit shift register. Both the address register 5 and the data register 7 operate in several operating modes and those operation modes are changed over by a mode decoder 8 and a mode register 9 in accordance with a mode signal issued from the external control circuit 2.

Listed below are the six different operation modes used in accordance with the preferred embodiment of the invention:

read-out mode . . . memory contents of the address designated by the address register 5 is read out to the data register 7.

write-in mode . . . memory contents from the data register 7 is written in an address designated by the address register 5.

erase mode . . . memory contents of an address designated by the address register 5 is erased (all bits are set to "0").

output mode . . . memory contents stored in the data register 7 is transferred to the control circuit 2.

input mode . . . data signal transferred from the control circuit 2 is applied and stored in the data register 7.

address input mode . . . address signal transferred from the control circuit 2 is applied and stored in the address register 5.

Those signals designating these operating modes are transmitted together with various data signals from the control circuit 2 through the data line. Distinction between the data signals and the mode-designating signals is carried out by sending switch-over signals through a separate switch-over signal line (not shown in the diagram). Also a shift clock necessary for these operations is supplied from the control circuit 2 through a clock line (not shown in the diagram). Hereupon, 10 is an input-output circuit (interface circuit) through which those various signals described above are transferred to and from the control circuit 2.

The control circuit 2 comprises mainly a microcomputer 11 which controls the memory circuit 1 in a manner described below and an instruction ROM 12 which stores a program for instructing the operation of the microcomputer 11.

Refreshing Method

In the following a, detailed explanation is given for the method of refreshing the MNOS memory 3 in the present device.

Figure 2:
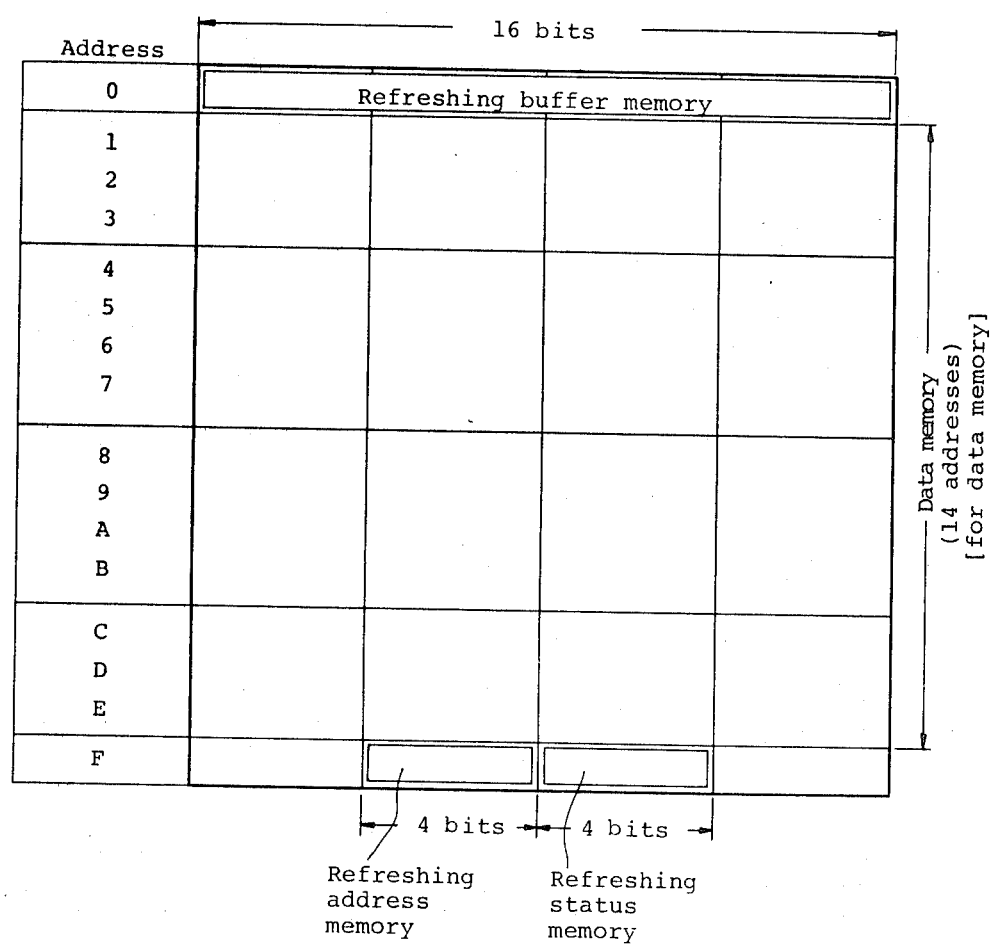
FIG. 2 is a schematic drawing of the preferred embodiment of the memory device.

The memory area of the MNOS memory 3 is divided into three sections, firstly "0", secondly "F", and thirdly "1", "2", "3", "4", "5", "6", "7", "8", "9", "A", "B", "C", "D" and "E", as shown in FIG. 2. Hereinafter the address is referred to by using the quotation marks, for example "0", and an address signal stored in that address, (i.e., contents of that address or data) to represent the address is referred to without such quotation marks, for example 0. The first memory area of the MNOS memory 3, that is, the memory area of address "0", is used as a buffer memory for storing temporarily the data signal of an address whose contents are to be refreshed during the refreshing operation. The second memory area, that is, the memory area of address "F" is used both as a refreshing address memory and as a refreshing status memory. The refreshing address memory uses a 4 bit area in the address "F" and stores a binary 4 bit refreshing address signal RA representing an address "RA" at which the refreshing operation is in progress. The refreshing status memory uses another 4 bit area also in the address "F" and stores a binary 4 bit refreshing status signal RS representing the statuses of the refreshing operation, that is, complete finish or half finish (details will be given later) of the refreshing action. Then the third memory area, that is, the memory area of the remaining 14 addresses is used as a data memory area. An example of the data signals stored in this data memory area is, for instance, a binary coded signal representing tuning voltages of the electronic tuner of TV sets. Hereupon, for the refreshing address memory and for the refreshing status memory, memory areas belonging to different addresses, respectively, may also be used.

Next, the refreshing operation of the present embodiment is explained with referring to the flow chart of FIG. 3.

[Process 1]

When the refreshing routine is called from a main routine, first the address signal of the address "F" is issued from the control circuit 2 to the memory circuit 1. This address signal is written in the address register 5, therefore the address "F" of the MNOS memory 3 is designated, that is, the refreshing address memory and refreshing status memory are designated. Then from this address "F", the refreshing address signal RA and the refreshing status signal RS are read out to the data register 27 and they are sent out to the control circuit 2 through a data line 72.

[Process 2]

In the control circuit 2, the microcomputer 11 discriminates whether the refreshing status signal RS indicates a specific coded signal representing the status of finishing all the necessary refreshing action at a certain address (specific coded signal in this case is, hereinafter, called a finish signal) or indicates a non-specific coded signal. In the case of a non-specific coded signal, namely, other than the finish signal, there is another specific coded signal representing the status of half-finish, that is, the status of finish only to halfway of the necessary refreshing action (the specific coded signal in this case is, hereinafter, called a half-finish signal), and any signal other than the above specific coded signal.

[Process 3]

When the refreshing status signal RS was set to the finish signal in a preceding refreshing operation, the refreshing address signal RA which was read out to the control circuit 2, also in the preceding operation, is now converted into a 16 bit serial signal from a binary 4 bit parallel signal in the control circuit 2 and issued to the memory circuit 1 and written into the address register 5, thereby an address "RA" in the MNOS memory 3 is designated. This address "RA" can be any one of the data memory areas, "1" to "E", of the MNOS memory. Then a data signal stored in the address "RA" is read out to the data register 7. During this action, the data signal in the address "RA" is left without any change in that address "RA".

[Process 4]

The address signal "0" is issued from the control circuit 2 and it is written into the address register 5, thereby the address "0", that is, the refreshing buffer memory is designated. Then the data signal of the refreshing address "RA" which was read out to the data register 7 in the preceding process is written into this refreshing buffer memory. In this action, for writing into the MNOS memory 3, it is necessary that all the memory contents of the address to be written in are first erased and thereafter the data signal from the data register 7 is written in; therefore in the flow chart of FIG. 3, this writing-in process is shown in separate two steps. Thus the data signal of the refreshing address "RA" can be stored in the refreshing buffer memory of the address "0".

[Process 5]

Up to the above process, the refreshing action of the address "RA" is completed halfway. Then the address signal of the address "F" is issued from the control circuit 2 and it is written into the address register 5. And then the binary 4 bit refreshing address signal RA, which indicates the refreshing address is under the refreshing action, and also the binary 4 bit refreshing status signal RA of the half-finish signal, which indicates that the refreshing action is completed half-way, are also issued from the control circuit 2 and written into the data register 7. Next, after the contents of the address "F" are erased, the refreshing address signal RA of the address "RA" is written into the refreshing address memory, and the refreshing status signal RS of the half-finish is written into the refreshing status memory.

[Process 6]

Following the above process, the address signal of the address "0" is issued from the control circuit 2 and written into the address register 5, thereby the data signal of the refreshing address "RA" which was written in the refreshing buffer memory of the address "0" in the preceding process is read out to the data register 7. On this step, the data signal is left in the refreshing buffer memory without any change.

[Process 7]

Next, the address signal of the refreshing address "RA" is issued from the control circuit 2 and written into the address register 5. Then the memory contents of this refreshing address "RA" is all erased and then the data signal which formerly existed in the address "RA" is written again in the same address from the data register 7. With the above processes, the refreshing action of the refreshing address "RA" is all completed.

[Process 8]

Then, the address signal of the address "F" is again issued from the control circuit 2 and written into the address register 5. And the binary 4 bit address signal RA-1 indicating the address "RA-1" (which is the address to be refreshed next to the address "RA" of the data memory at which the refreshing action has just been completed) and the refreshing status signal RS of the finish signal indicating the completion of the refreshing action are issued from the control circuit 2 and written into the data register 7. Next, the memory contents of the address "F" is erased, then from the data register 7 the refreshing address signal (RA-1) and the refreshing status signal of the finish signal are written into the refreshing address memory and the refreshing status memory, and by this process one refreshing routine is completed. Hereupon, when the address signal (RA-1) indicating the refreshing address to be refreshed at the next chance of the routine operation becomes the one indicating the address "0" or the address "F", this address signal (RA-1) is corrected to the one indicating the address "E".

Thus, comparing the present state of the MNOS memory 3 with the state at the start of the refreshing routine, it is understood that the data signal at the address "RA" has been refreshed and the refreshing address signal RA in the refreshing address memory has been changed to the address "RA-1", thereby all the refreshing routine becomes completed.

[Process 9]

Hereupon, in the process 2, during the discrimination step of the refreshing status signal RS, and when the refreshing status signal is not the finish signal, as the next step, still another discrimination step is processed. This process is to discriminate whether this refresh status signal RS is the half-finish signal or not. When the result of this discrimination process is the "half-finish signal", the flow of this refreshing routine is jumped to the process 6 and the subsequent processes are carried out after this. When the result is not the half-finish signal, the refreshing routine is jumped to the process 8.

By the processes described above, the refreshing operation of the non-volatile memories such as the MNOS memory can be performed in accordance with the present invention.

Operation to Protect the Memory Contents

In the following, the protection of the memory contents against the power supply shut-off during arbitrary processing steps in the refreshing routine is explained.

[During the processes 1 to 4]

In this case, in any step in these processes, the data signal in the address "RA" is still left without any change. Also the contents of the refreshing address memory and of the refreshing status memory are also left without any change. Therefore, when the execution of this refreshing routine is started with the resumption of the power supply, the refreshing operation is executed again from the process step 1. Accordingly, for example, even if the memory contents of the refreshing buffer memory are changed in accordance with the process 4, no inconvenience occurs, thus there is no problem for the power supply shut-off during the processes 1 to 4.

[During the process 5]

In this case, there will be a problem when the power supply shut-off occurs (i) after the step of erasing the memory contents of the refreshing address memory and the refreshing status memory or (ii) during the writing-in or erasing action of those memories. In the latter (ii) case, the memory contents are disturbed. In either of the above cases, the contents of the refreshing status memory becomes the one which is different either from the finish signal or from the half-finish signal. Because of the above, in this case, when the refreshing routine is executed at the next chance of power supply resumption, in both discrimination processes of the process 2 and the process 9 for the refreshing status signal RS, the discrimination gives a result of false, that is "no". Therefore, without proceeding into the abovementioned processes 3 to 7, the refreshing routine jumps to the process 8, and hence no false refreshing operation takes place. And in the process 8, both the refreshing address signal RA and the refreshing status signal RS are set to the correct initial state, and hence the correct refreshing operation is assured to be executed from the next chance of the start of the refreshing routine.

Hereupon, for obtaining a correct detection of the disturbances in the refreshing status signal RS, both of the finish signal and the half-finish signal are set to codes of repeated combination "1" and "0" which are the codes most scarcely met in random operations. For example, the finish signal is set to "1010", while the half-finish signal is set to "0101".

[During the process 6]

In this case, the data signal is still left unchanged in both the refreshing address "RA" and the refreshing buffer memory, also the half-finish signal is left in the refreshing status memory and the address signal of the refreshing address "RA" at which the refreshing operation is in process. Therefore when the refreshing routine is started at the next chance of the resumption of the power supply, this refreshing routine is executed through the process 2 and the process 9; that is the process is executed skipping the processes 3 to 5. And then, only the latter half part of the refreshing operation namely, from the process 6 and on, is executed again, thereby a correct refreshing operation is executed.

[During the process 7]

In this case, if the power supply is shut off during either the erasing or the writing-in action of the data signal of the refreshing address "RA", there is a fear that the data signal is lost or disturbed at this refreshing address "RA". Even in this case, however, the data signal is still left unchanged in the refreshing buffer memory, and also the refreshing status signal RS and the refreshing address signal RA are kept in the complete form. Therefore, similarly to the preceding case, when the refreshing routine is started at the next chance of the resumption of the power supply, this refreshing routine is executed through the process 2 and the process 9; that is the present is executed skipping the processes 3 to 5. And then, only the latter half part of the refreshing operation namely, from the process 6 and on, is executed again, thereby a correct refreshing operation is executed again; that is, the correct data signal is read out from the refreshing buffer memory and written again into the refreshing address "RA". Thus the correct refreshing operation is executed.

[During the process 8]

In this case, the execution of the refreshing routine is similar to the process 5 described before. That is, in the next chance of the refreshing operation, the routine proceeds through the process 2 and process 9, and then it is executed from the process 8. Therefore, the refreshing routine is again executed from the correct state.

As has been described above, in accordance with the refreshing method of the present invention, even if the power supply is shut off at any moment of the refreshing operation, the fear of the loss or the false conversion of data at an address to be refreshed is completely removed, thereby the reliable protection of the memory in the refreshing operation becomes possible.

In addition to this, as is clear from the above explanation, the present method does not require any bulky and expensive peripheral circuit using such as capacitors of large capacitance as in the conventional scheme and it can be performed only with the control instructed by a refreshing routine issued from a control circuit, and thereby a simple system of low cost can easily realized.

What is claimed is:

1. An apparatus for refreshing a non-volatile memory having a plural number of addresses comprising:
   (a) a data register connected to an input-output circuit of said non-volatile memory;
   (b) an address register connected to an address driver of said non-volatile memory;
   (c) an input circuit connected to said data register and said address register;
   (d) a control circuit means including a microcomputer and an instruction ROM;
   (e) a non-volatile refreshing buffer memory for, in the refreshing operation of said non-volatile memory, temporarily storing the contents of an address selected sequentially from said non-volatile memory; and
   (f) said control circuit means including means for issuing control signals for reading a data signal out from a selected address of said non-volatile memory, writing said read out data into said non-volatile refreshing buffer memory, reading out said data signal from said non-volatile refreshing buffer memory, and writing said read out data signal again into said selected address from which the data signal was read out.

2. An apparatus for refreshing a non-volatile memory in accordance with claim 1 wherein said refreshing buffer memory is provided with an address of said non-volatile memory.

3. An apparatus for refreshing a non-volatile memory in accordance with claim 1 further comprising a non-volatile refreshing address memory for accessing a selected address of said non-volatile memory wherein said selected address is designated by said refreshing address memory.

4. An apparatus for refreshing a non-volatile memory in accordance with claim 3 wherein either one or both of said refreshing buffer memory and said refreshing address memory are set in an address of said non-volatile memory.

5. An apparatus for refreshing a non-volatile memory in accordance with claim 3 further comprising a non-volatile refreshing status memory and means for reading out respectively from said refreshing address memory and said refreshing status memory, a refreshing address signal and a refreshing status signal,
   means for determining from said refreshing status signal whether the refreshing operation is finished or not,
   means for reading out a data signal from an address of said data memory designated by said refreshing address memory when said refreshing status signal indicates the finish of a refreshing operation,
   means for writing said data signal into said refreshing buffer memory,
   means for writing into said refreshing status memory a refreshing status signal indicating the half-finish of the refreshing operation after said data signal is written into said refreshing buffer memory,
   means for reading out said data signal from said refreshing buffer memory,
   means for writing said data signal read out from said refreshing buffer memory into said refreshing address of said data memory,
   means for writing an address signal of said data memory which is to be refreshed in a next refreshing operation into said refreshing address memory after said data signal is written into said refreshing address of said data memory, and means for reading said data signal of said refreshing address out of said refreshing buffer memory when said refreshing status signal indicates the half-finish of said refreshing process.

6. An apparatus for refreshing a non-volatile memory in accordance with claim 5 wherein said non-volatile refreshing buffer memory, said refreshing address memory, and said refreshing status memory are set respectively to addresses of said non-volatile memory.

7. A method for refreshing a non-volatile memory having a plural number of addresses comprising the steps of:
  (a) reading out from an address of said non-volatile memory a data signal,
  (b) writing said read out data into said non-volatile refreshing buffer memory,
  (c) reading out said data signal from said non-volatile refreshing buffer memory, and
  (d) writing said read out data signal again into said address from which the data signal was read out.

8. A method for refreshing a non-volatile memory in accordance with claim 7 wherein some address location in said non-volatile memory is used as the refreshing buffer memory.

9. A method for refreshing a non-volatile memory in accordance with claim 7 wherein a non-volatile refreshing address memory is utilized and wherein the address to be refreshed is stored in said refreshing address memory.

10. A method for refreshing a non-volatile memory in accordance with claim 2 wherein either one or both of said refreshing buffer memory and said refreshing address memory are set in an address of said non-volatile memory.

11. A method for refreshing a non-volatile memory in accordance with claim 9 comprising the following sequential steps in the refreshing process:
  (a) reading out respectively from said refreshing address memory and said refreshing status memory a refreshing address signal and a refreshing status signal,
  (b) determining whether said refreshing status signal indicates the finish of the refreshing operation or not,
  (c) reading out a data signal from an address of said data memory designated by said refreshing address memory when said refreshing status signal indicates the finish of the refreshing operation,
  (d) writing into said refreshing buffer memory the data signal designated by said refreshing address memory,
  (e) writing a refreshing status signal indicating the half-finish of the refreshing operation into said refreshing status memory,
  (f) reading out from said refreshing buffer memory the data signal of said refreshing address,
  (g) writing into said refreshing address of said data memory the data signal read out to said refreshing buffer memory,
  (h) writing into said refreshing address memory an address signal of said data memory which is to be refreshed in the next refreshing operation, and
  (i) returning to step (f) the process of refreshing said non-volatile memory when said refreshing status signal read out in step (a) indicates half-finish of said refreshing process.

12. A method for refreshing a non-volatile memory in accordance with claim 11 wherein said non-volatile refreshing buffer memory, said refreshing address memory, and said refreshing status memory are set, respectively, to addresses of said non-volatile memory.

* * * * *